United States Patent [19]
Greaves et al.

[11] Patent Number: 5,872,565
[45] Date of Patent: Feb. 16, 1999

[54] REAL-TIME VIDEO PROCESSING SYSTEM

[75] Inventors: Paul E. Greaves, Granite Bay; John F. Weber; David E. Porter, both of Sacramento; Michael Richard Young Moore, Rancho Cordova, all of Calif.

[73] Assignee: Play, Inc., Rancho Cordova, Calif.

[21] Appl. No.: 757,747

[22] Filed: Nov. 26, 1996

[51] Int. Cl.$^6$ ...................................................... H04N 9/74
[52] U.S. Cl. .......................... 345/328; 348/589; 348/720; 348/722
[58] Field of Search ............................. 345/328; 348/460, 348/575, 578, 584–601, 720, 722; 456/63; H04N 5/14, 9/74, 5/91

[56] References Cited

U.S. PATENT DOCUMENTS

| | | |
|---|---|---|
| 5,227,863 | 7/1993 | Bilbrey et al. . |
| 5,786,814 | 7/1998 | Moran et al. ............................ 345/328 |
| 5,793,445 | 8/1998 | Lum et al. ............................... 348/720 |

*Primary Examiner*—Nathan Flynn
*Attorney, Agent, or Firm*—Carr & Ferrell LLP

[57] ABSTRACT

A video processing system includes but structure, signal flow, and components to process and combine audio and video signals with improved power, cost-effectiveness, and flexibility. The system includes one or more input modules to convert input video signals to a predetermined format. A router routes converted video signals to selected ones of upstream processing cards, which perform video processing such as digital video effects, frame synchronization, non-linear editing, cascading, filtering, and the like. Signals from the upstream processing cards are directed to a switcher, which selectively mixes the upstream-processed signals. A switcher preview module may be provided to intermediately view signals provided by the switcher. The switcher is also attached to a series of downstream video processing cards, which may insert logos, add overlaying, and other suitable post-mixing functions. An output encoder converts signals from the downstream video processing cards into a desired output format, presenting these signals to I/O modules. The I/O modules may also provide input used by the downstream video processing cards. A coordinator manages interaction among the various foregoing modules. Another aspect of the invention involves a motherboard for the video processing system, including a main control bus, secondary control bus, video bus, composited signal video lines, and a number of slots for interconnecting video processing hardware components to the busses and lines.

37 Claims, 11 Drawing Sheets

REAL-TIME VIDEO PROCESSING SYSTEM

BACKGROUND OF THE INVENTION

1. Field of the Invention

The present invention relates to video processing systems. More particularly, the invention concerns a low-cost system for processing and combining video signals, including a bus structure, signal flow, and components having improved power, flexibility, and cost-effectiveness.

2. Description of the Related Art

To produce a composite video image, a video producer may combine two, three, four, or more video images together to produce a single composite scene. A wide variety of effects may be created; for example the producer may require a certain section of an image to be reduced and displayed in a selected region within the composite scene and/or to move across the background. Furthermore, before or after combining the images, the producer may wish to process one or more of the images to provide effects such as morphing, etc.

Conventional video processing systems include a number of specialized separate components, each performing a specific function. A conventional switcher is used to combine video signals from various video sources such as a VCR, a digital disk, or a disk drive, and other video sources, and is used to combine video segments as well as audio. Another component may be connected to provide morphing capability, and still another component may provide other effects. All these independently-designed separate components (which may or may not work well together) are connected together to form a complete system. The conventional switcher is also used to combine video segments with audio. Unfortunately, each component can have high cost and it can be difficult or impossible to coordinate all the components to function in even a minimally cooperative manner, much less in an optimal manner.

Known video production systems are also limited most do not perform processing in "real-time". Real-time processing systems are either not available or only attainable at a high cost (and with limited capability). Therefore such real-time systems are available only to high-end producers such as movie studios. In component-based systems, it may be difficult or impossible to operate all these components simultaneously in real-time.

More particularly, real-time processing is difficult to achieve due to the tremendous amount of processing that goes into creating even a single digital image. Video signals define a frame and each element (e.g. a pixel) within the frame. To define an image moving across a screen, each frame is usually updated at least sixty times per second in order to avoid flicker and other undesirable effects. Due to the number of calculations and processing required to generate such an image, conventional video processing systems necessitate a rendering process before the composite video can be available for viewing, unless the video production system includes an expensive high performance computer with a large and expensive memory. A rendering process can delay viewing the video composite for several seconds or even minutes, thereby effectively preventing real-time editing and all the advantages that go with it.

SUMMARY OF THE INVENTION

Broadly, the invention concerns video processing system that provides powerful and flexible real-time video processing at a low cost. The video processing system combines video processing, switching, and other processing functions such as input and output in a single unit on a single motherboard, all under the control of a single coordinator. The coordinator can receive its commands from a conventional PC, or from dedicated input devices such as a specialized keyboard or other specialized input device. Responsive to these commands, the video processing system can process one or more video and alpha signals in real-time and output the result in real-time.

According to one embodiment of video processing system, one or more input modules convert input video signals to a predetermined format. A router routes converted video signals to selected ones of upstream video processing cards, which perform video processing such as digital video effects, frame synchronization, non-linear editing, "cascading", filtering, and the like. Signals from the upstream video processing cards are directed to a switcher, which selectively mixes the upstream-processed signals. A switcher preview module may be provided to intermediately view signals provided by the switcher. The switcher is also attached to a series of downstream video processing cards, which may insert logos, add overlaying, and other suitable post-mixing functions. An output encoder converts signals from the downstream video processing cards into a desired output format, presenting these signals to I/O modules. The I/O modules may also serve to provide input used by the downstream video processing cards. A coordinator manages interaction among the various foregoing modules. Another aspect of the invention involves a motherboard for the video processing system, including a main control bus, secondary control bus, video bus, composited signal video lines, and a number of slots for interconnecting video processing hardware components to the busses and lines.

The video processing system of the invention provides significant advantages for a user. The user can manipulate and process the video and alpha signals, and observe the effects immediately in real-time. Such real-time processing can increase productivity, enhance creativity, and improve the quality of the finished video composite.

Another advantage is the system's low cost. Conventional video processing systems of similar ability typically involve specialized hardware components and software, pushing the cost of these systems into the range of several hundred thousand dollars. Unlike these systems, the video processing system of the invention is constructed with a uniquely flexible motherboard, which accommodates a variety of video components. The construction and arrangement of the components of the invention yields an extremely powerful yet inexpensive video processing system. This system may even utilize a relatively inexpensive personal computer as an operator interface.

Another advantage of the invention is that it may be constructed as a single integrated system, unlike many known video processing systems, which require the purchase and interconnection of various independent components.

Still another advantage of the present invention is its flexibility. Due to components such as the motherboard of the present video processing system, the invention is both versatile and flexible. The system, for example, may be expandable with a variety of video processing cards having predetermined configuration requirements that attach to a plurality of slots provided in the motherboard, where each card is capable of providing different processing capabilities. The system design provides high bandwidth, and is based on a modular concept for flexibility and future expansion. In one embodiment, all inputs, regardless of their formats, are converted at the input module to high resolution CCIR-601 digital format, which is maintained through all subsequent processing operations. After processing is complete, conversion to any desired format may accomplished at the output module. Furthermore, the motherboard may be implemented with 10-bit architecture, enabling the system to later upgrade to hardware products employing high-end 10-bit formats, while initially utilizing products and accessories with 8-bit signals.

Due to the flexibility of the invention, it may be implemented to perform a variety of purposes, such as post production, live production, graphics production, and audio production. The invention may also be used to perform pixel-by-pixel processing, in contrast to the frame or line-processing of previous systems. Furthermore, the video processing cards can be reconfigured to operate a variety of different programs. This capability also provides a way to update the cards' operation without replacing them. The cards can be programmable, even as to their method of operation.

BRIEF DESCRIPTION OF THE DRAWINGS

The nature, objects, and advantages of the invention will become more apparent to those skilled in the art after considering the following detailed description in connection with the accompanying drawings, in which like reference numerals designate like parts throughout, wherein.

DETAILED DESCRIPTION OF THE PREFERRED EMBODIMENTS

Overview

The following is intended to provide an introduction to the video processing system described herein. The system includes a combination of busses, circuits, and processing circuits, each having a separate purpose and function as disclosed herein. In the following overview, reference will be made generally to FIG. 1, which is a diagrammatic illustration of the overall system. A detailed description of each of the components follows this overview. In order to enhance understanding, the busses of FIG. 1 are shown as vertically-extending boxes, and the circuits of FIG. 1 are shown as horizontally-extending boxes that span across the busses to which they are connected.

Signal Processing Path

Figure 1:
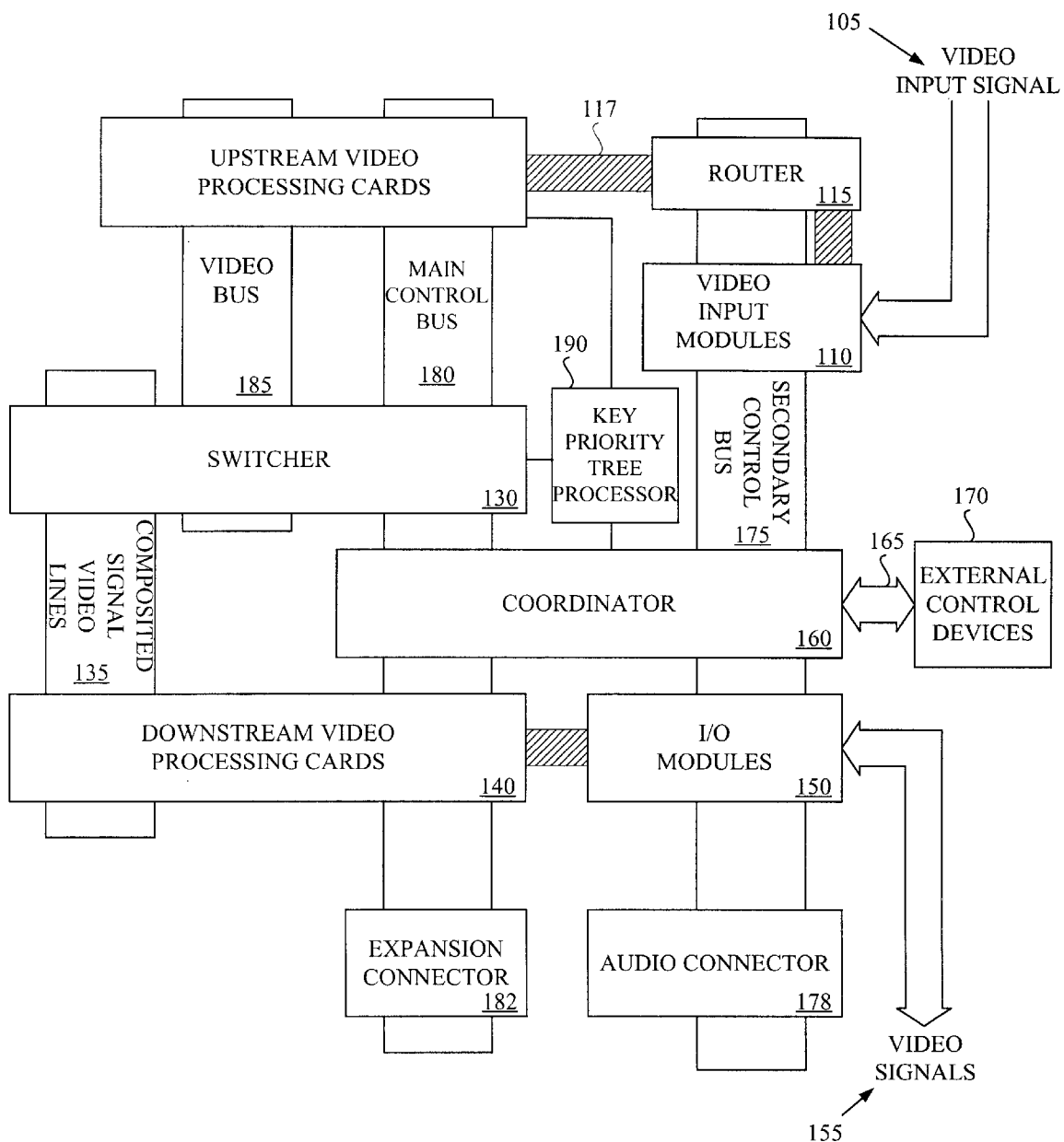
FIG. 1 is a hardware diagram of the overall video processing system of the invention.
Figure 2:
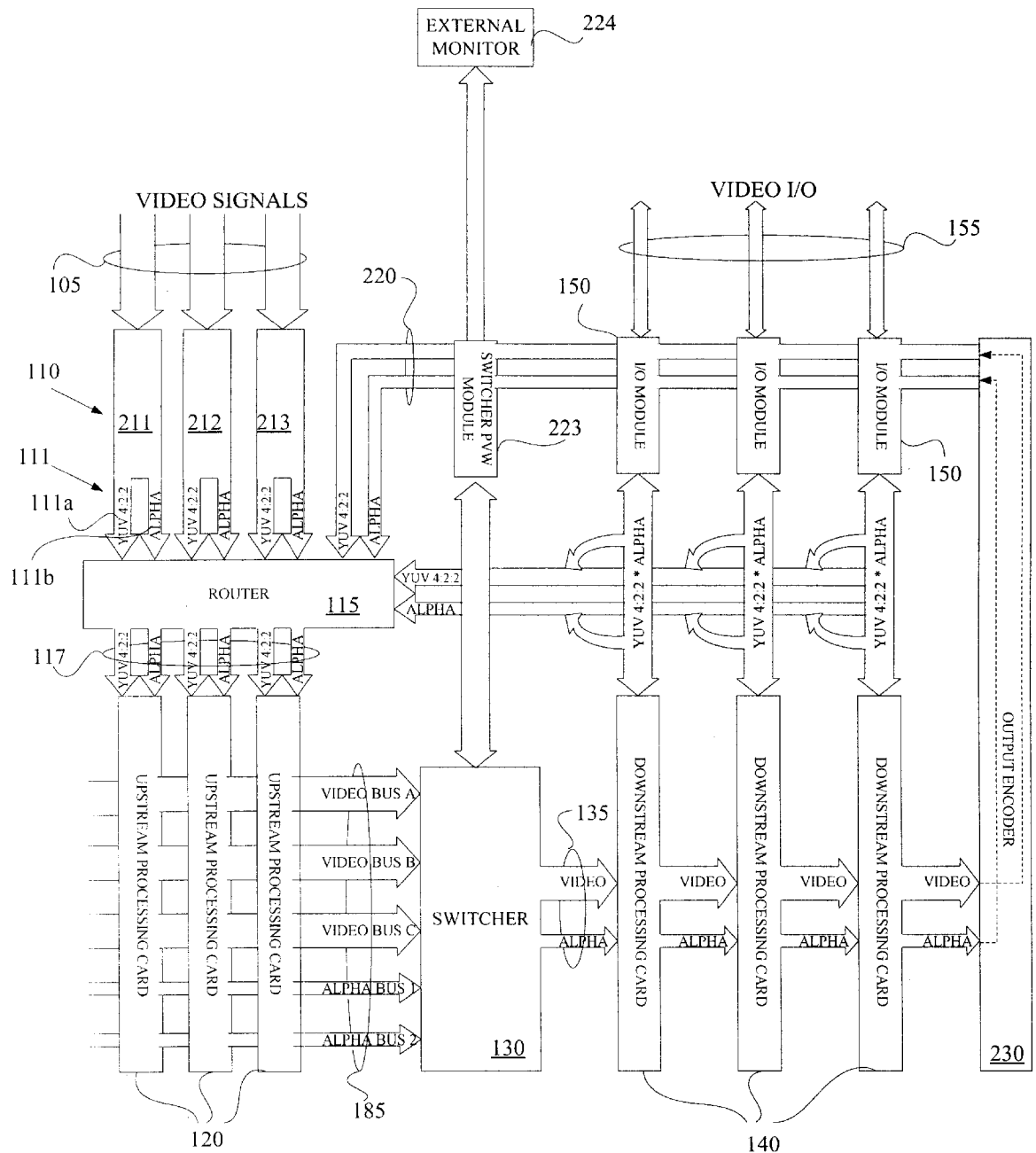
FIG. 2 is a signal flow diagram illustrating the operation of the invention.

Reference is now made to FIG. 2 in conjunction with FIG. 1. FIG. 2 is a block diagram illustrating video signal flow in one embodiment of the video processing system shown in FIG. 1.

One or more video input signals, illustrated generally at 105, having a video and/or alpha format, are supplied to the video processing system for processing. These video formatted signals may have any of a plurality of well-known formats, such as BNC-composite, serial digital, parallel digital, RGB, consumer digital video, or MPEG data stream, to name a few examples. These signals may include alpha signals which define the percentage from each source that will be mixed together on a pixel-by-pixel basis. The source of these video input signals 105 may be a disk drive, magnetic tape, digital camera, camcorder, or another suitable video source.

These video input signals 105 are applied, respectively, to a plurality of video input modules 110 including a first input module 211, a second input module 212, and a third input module 213. In one embodiment, for example, there may be seven (7) video input modules 110. Particularly, each video input signal 105 is applied to one of the input modules, which operates to convert the video signal into a standard format, preferably a digital D1 (CCIR-601) format. Subject to control from the coordinator (described below), these video input modules 110 also synchronize the converted input signals. The video input modules 110 may also color correct the video input signals 105 if desired. The input modules supply their converted signals to a router 115.

In addition to the converted input signals from video input modules 110, the router 115 can also receive input video signals 220 from an output encoder 230 along a signal path 220, as described in greater detail below. Furthermore, the router 115 can also receive input signals from downstream video processing cards 140 as well as I/O modules 150. The router 115, responsive to control signals from the coordinator (to be described) switches the converted video input signals to output lines 117 that are coupled to upstream video processing cards 120. The router 115 may direct a single signal to a plurality of upstream video processing cards, or it may supply one signal to one card, a second signal to another card, and so forth.

Each upstream video processing card 120 may provide a plurality of different functions. The upstream video processing cards 120 supply processed video signals (which may be a video signal and/or alpha signal) to a switcher 130.

In the switcher 130, the video format signals from the upstream video processing cards are combined, sometimes under control of an alpha signal, to form a "composited signal video lines" 135. The resulting composited signal video lines 135 is supplied over composited signal video lines 135 to a first downstream video processing card 140 of a plurality of such cards coupled in series. Prior to passing the composited signal to the next downstream video processing card 140 in order, each downstream video processing card 140 may process the signal by performing operations such as adding subtitle text, performing downstream keying operations, logo addition, overlay, encoding, etc. Each downstream video processing card 140 is also coupled to a corresponding video I/O module 150; each I/O module 150 may provide video signals 155 to its corresponding downstream processing card, or receive video signals 155 therefrom. In addition, the output from the downstream video processing cards 140 can be supplied to the router 115, which can direct these signals back to a selected upstream video processing card, in the same manner as with the video input signals.

The switcher 130 is additionally coupled to a switcher preview module 223, which may be attached to an external monitor 224, by correcting video signals of the switcher 130 into a suitable output format. In addition, each downstream video output may be provided to an output encoder 230 which then supplies its output to the I/O modules 150.

Busses and Control

Referring to FIG. 1, a coordinator 160 provides high-level control to the processing circuits described herein. The coordinator 160 is provided with a VideoNet interface 165 for exchanging data and control information with an external control device 170. The external control device 170 may comprise a personal computer (PC), a keyboard, or one or more switches, levers, knobs, or any control device for providing commands to the coordinator. The VideoNet interface 165 may be a custom or conventional high speed communications interface, and one preferred external control device 170 is a PC.

Secondary Control Bus

A secondary control bus 175 connects the coordinator 160, the video input modules 110, the router 115, and the I/O modules 150. Additionally, an audio connector 178 may be coupled to the secondary control bus 175, which advantageously allows synchronization and coordination between the audio and video signals being processed. The secondary control bus 175, which will be described in greater detail, is configured for exchanging control information and data between the coordinator 160 and the other circuit components coupled thereto. In the illustrated example, the secondary control bus 175 included eight sub-busses, where each sub-bus includes a 10-bit YUV bus and a 5-bit multiplexed alpha bus. Reference is made, for example, to the video input bus 111 (FIG. 2) shown between the video input modules 110 and router 115, such as the 10-bit YUV bus 111a and the 5-bit alpha bus 111b. As described in greater detail below, the secondary control bus 175 includes configuration lines dedicated for configuring the upstream video processing cards 120 and other components on the bus during startup or whenever necessary.

Main Bus Control

With reference again to FIG. 2, a main control bus 180 couples the coordinator 160 with the upstream video processing cards 120, the switcher 130, and the downstream video processing cards 140. In addition, the main control bus 180 may include an expansion connector 182 to exchange control information to an additional component. For example, the expansion connector 182 may be used for an audio connector, either in conjunction with, or in lieu of the audio connector 178 coupled to the secondary control bus 175.

The main control bus 180, which will be discussed in greater detail, generally provides high speed exchange of control information and data between the coordinator 160 and the circuits coupled thereto. Additionally, the main control bus 180 includes configuration lines dedicated for configuring the upstream video processing cards 120 and other components on the bus during startup or whenever necessary. Also, the main control bus 180 provides a system for the coordinator to initiate and manage direct memory access (DMA) transfers of data between any of the circuits coupled to the main control bus. DMA transfer is especially useful for exchanging data with the upstream video processing cards 120, which may require large blocks of data and control information to initiate and/or perform their intended processing functions.

Video Bus

A video bus 185 connects the output of the upstream video processing cards 120 with the switcher 130. Particularly, each of the upstream video processing cards 120 is connected to each of the lines in the video bus 185. In the embodiment shown in FIGS. 1 and 2, the video bus 185 includes three video format busses and two alpha busses, but it should be apparent that in any particular configuration, the number of each type of bus may vary according to the complexity and needs of the system.

At each connection, an enabling circuit (not shown) is provided, controlled by a key priority tree processor 190. The key priority tree processor 190 receives control information from the coordinator 160 and/or the upstream video processing cards 120, and enables the appropriate enabling circuit to connect the appropriate video processing card to a selected one of the video bus 185. The key priority tree processor 190 may also be connected to the switcher 130 for the purpose of multiplexing input from the video busses 185 into the switcher 130. As described in greater detail below, the key priority tree processor 190 preferably operates on a pixel-by-pixel basis.

The video bus 185, for example, may include a plurality of sub-busses, where each sub-bus includes a 20-bit video signal bus or a 10-bit alpha signal bus. In one implementation of the invention, each 20-bit video signal bus may be used to carry 10 luminance bits and 10 chrominance bits simultaneously, or to carry luminance and chrominance bits alternatively to free bus lines for other uses.

Functions

Using the above features, a wide variety of audio and video production techniques can be obtained. As a first example, converted video input signals from the input modules are independently processed by the upstream video processing cards 120. The upstream video processing cards 120 themselves may exchange signals ("cascading") so that an image may be processed by multiple upstream video processing cards. As mentioned above, these functions may include digital video effects, frame synchronization, non-linear editing, filtering and the like. These upstream-processed signals may then be further processed by the downstream video processing cards, which may add logos, insert overlays, etc. The downstream video processing cards may also combine the upstream-processed signals with video or other input signals from the I/O modules 150. The final output is encoded by the output encoder 230.

As described in greater detail below, the invention may be implemented to perform post production, live production, graphics production, audio production, and other useful audio and video production techniques.

Motherboard

The motherboard of the preferred embodiment provides a modular, highly configurable video and audio hardware architecture. Video signals may be distributed internally on the motherboard as 10-bit 4:2:2:4 (Y,R-Y,B-Y,alpha) digital streams. Preferably, the video processing cards connected to the motherboard may process either 8-bit or 10-bit data, for example. This flexibility allows the user of the invention to conveniently upgrade from 8-bit to 10-bit processing without having to replace the entire system. An audio component (not shown) may reside adjacent and below the video motherboard on a separate audio card (not shown), isolated for reasons including noise.

Figure 3:
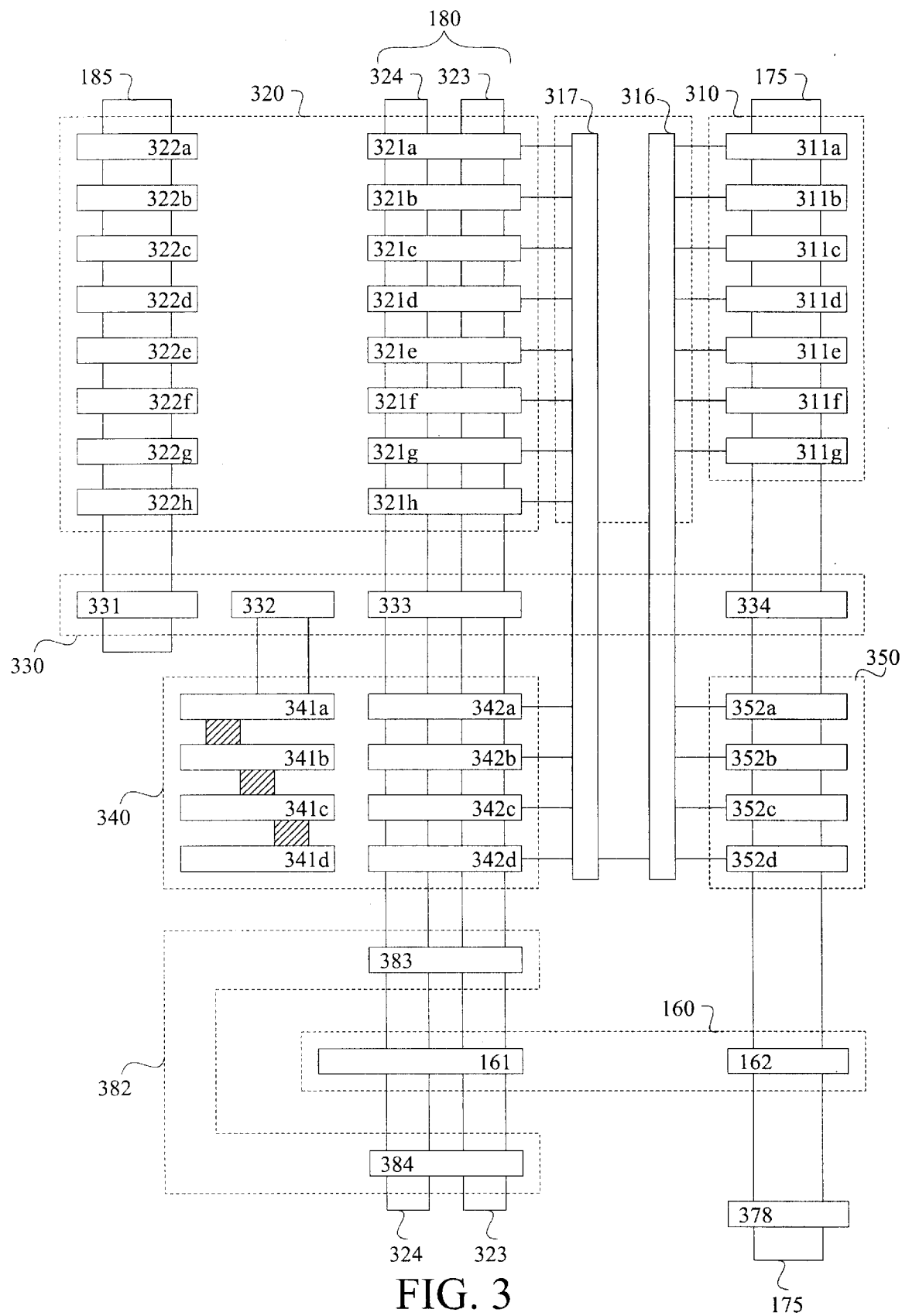
FIG. 3 is a hardware diagram illustrating an exemplary motherboard layout in accordance with the invention.

Reference is now made to FIG. 3 which depicts the layout of the motherboard of the preferred embodiment of the video processing system. As with FIG. 1, the bus connections of FIG. 3 are shown in a vertically-extending manner, while the slots provided for insertion of circuit components are shown horizontally-extending. To correspond with FIG. 1, dotted boxes have been drawn in FIG. 3 around groups of slots that are provided for a particular set of circuit elements shown in FIG. 1.

A group of input module slots are shown in the dotted box 310, including a first input module slot 311a and a second input module slot 311b, and so forth. Each of the input module slots is connected to a group of router input slots 316. A group of router output slots 312 is also provided. The input slots 316 and output slots 317 are selectively coupled by the router 115 which resides in the slots 316–317, spanning therebetween. The output slots 317 are coupled to first slots 321a–321h of a plurality of upstream video processing card slots 320. The slots 320 also include second slots 322a–322h. The video cards to be inserted therein are intended to span across the first and second slots 321–322, which may conceivably comprise a single slot in other embodiments. In FIG. 3, the main control bus 180 includes a control and data bus 323 and a configuration bus 324. Although each of these busses may be located adjacent to each other, each may function substantially differently. Briefly, as will be described, the configuration bus 324 is utilized only during configuration of attached hardware components, while the control and data bus 323 is utilized after configuration to operate such components.

The left-hand slots 322a–322h of the upstream video processing card slots 320 are connected, via the video bus 185, to switcher slots 330. The switcher slots 330 include a plurality of slots (shown horizontally-aligned) including a first switcher slot 331 coupled to the video bus 185, a second switcher slot 332 coupled to the downstream video processing card slots 340, a third switcher slot 333 coupled to the main control bus 180, and a fourth switcher slot 334 coupled to the secondary control bus. The purpose of the fourth switcher slot 334 is to provide an output to preview the composite video signal supplied from the switcher.

A plurality of downstream video processing card slots 340 are provided to receive the downstream video processing cards 140. The downstream video processing slots 340 include a first downstream slot 341a coupled to receive the composite video line from the second switcher slot 332, a second downstream slot 341b coupled to the first downstream slot, and in like manner, a third downstream slot 341c coupled to the second downstream slot, and a fourth processing slot 341d coupled to the third processing slot. The downstream video processing card slots 340 also include a plurality of slots 342a–342d coupled to the main control bus. In addition, each of the slots 342a–342d is aligned with one of a plurality of output module slots 350. Particularly, each of the slots 342a–342d is associated with a corresponding one of the 352a–352d output slots.

A pair of coordinator slots 160 include a first coordinator slot 161 coupled to the main control bus 180 and a second coordinator slot 162 coupled to the secondary control bus 175. An audio connector slot 378 is coupled to the secondary control bus 175 for connection to an external audio device. A pair of expansion slots, illustrated at 382, include a first expansion slot 383 coupled to the main control bus 180 and a second expansion slot 384 also coupled to the main control bus 180.

DETAILED DESCRIPTION OF HARDWARE COMPONENTS INTERCONNECTIONS

Figure 4:
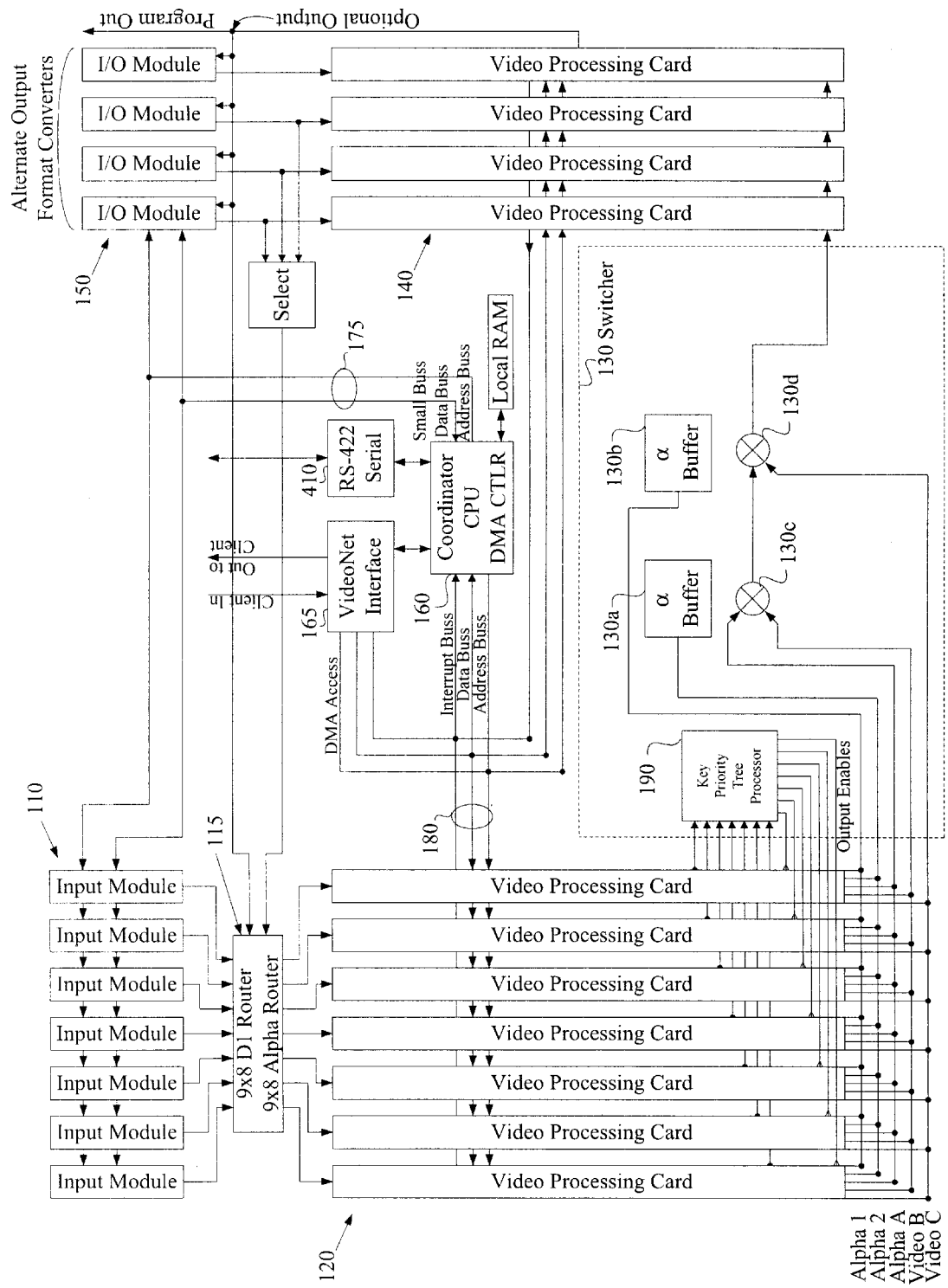
FIG. 4 is a hardware diagram illustrating the video processing system of the invention with a coordinator and a switcher being shown in greater detail.

Reference is now made to FIG. 4, which is a detailed block diagram showing hardware components and interconnections of the preferred embodiment of video processing system in accordance with the invention. Reference may also be made to FIGS. 1, 2 and 3 as appropriate.

Coordinator

The coordinator 160 orchestrates all of the resources inside of the video processing system to which it is connected via the busses, as well as providing communication via the VideoNet interface to a PC or other external control device. In an illustrative embodiment, the coordinator may comprise a Motorola model MC68ECO30 microprocessor with 16M of RAM. In response to signals or commands received, the coordinator 160 schedules video and audio events across the multiple circuits to which it is connected, in a real-time, deterministic fashion. Furthermore, it communicates with various cards inside of the system of the invention to query their capabilities, perform diagnostics, and provide list-oriented event descriptions. The coordinator 160 may also include an externally accessible serial port to receive inputs from additional external control devices, such as a switcher console, CMX editor, editing controller, or an audio controller.

Preferably the coordinator 160 includes sixteen serial ports, comprising from RS-422 drivers and twelve other ports. In one implementation, the twelve other ports may be TTL level serial ports to receive and communicate with cables according to RS-422, RS-232, or a multitude of other interface protocols.

The coordinator 160 contains a clocks (not shown) that functions as the synchronizing clock for the control busses 180/175.

VideoNet Interface 165

The VideoNet interface 165 in the preferred embodiment controls transfer of data between the coordinator 160 and an external control device 170 (FIG. 1), which is preferably a host PC or another suitable peripheral device. The VideoNet interface 165 includes a high-speed serial-digital interface capable of transferring data between devices at rates up to 400 megabits per second or beyond, in order to handle data at uncompressed D1 data rates. Preferably, the VideoNet interface 165 uses two cables, including one input cable and one output cable, designed to work effectively at large distances. These cables may be operational up to 250 feet using standard RG-59 BNC video cables, or up to 500 feet with RG-6 cabling. As an alternative the cables may comprise fiber optic conduit. The VideoNet™ interface may be configured for multiple PCs to utilize the same video processing system concurrently.

The VideoNet controller is designed to connect to a host computer via a custom peripheral connect interface (PCI) card that is directly connected to a conventional PCI bus on the host computer. To facilitate connection to different control devices, the PCI card may include 12 additional RS-422 control ports that can, for example be configured for control-L, Panasonic 5-pin, or a multitude of other serial protocols with external cables. Therefore, other external control devices can supply data and control information through the PCI card.

Video Input Modules 110

In the illustrated embodiment, the video input modules 110 each comprise a specialized, special-purpose circuit for converting the format of the input video signals into the internal standard video format, which in the preferred embodiment is the high-resolution CCIR-601 digital format.

Preferably, the video input modules 110 perform pixel time base correction, whereas spatial synchronization is achieved in the upstream video processing cards 120 (FIGS. 1–2). As an example, a plurality of video input modules 110 (such as seven) may be provided, each providing the conversion desired by the end user. For typical sources, the video input modules 110 may comprise one or two composite plus Y/C input modules. Each video input module 110 is designed to convert from a specific input format including, for example RGB, YUV, digital composite, serial and parallel digital component, or 24 fps film sync, into the internal standard CCIR-601 format. Thus, in order to convert a specific format into the internal standard format, it is only necessary to add an appropriate input module into one of the input module slots 310 (FIG. 3).

Preferably, each of the input modules delivers alpha data in addition to video data, and the alpha data is correctly timed and matched to the video data. As shown in FIG. 2, the video input modules 110 are coupled to the router 115 by video input bus 111. The 10-bit alpha data may be multiplexed onto a 5-bit bus, as shown in the illustrated example above. The data may be divided up into ODD (1, 3, 5, 7, 9) and EVEN (0, 2, 4, 6, 8) bits. This allows cards using only 8-bit data to deliver and/or gather bytes of data in a symmetrical manner.

A function of the input modules is to synchronize their video data stream to a system clock of the motherboard. Although the format of the data stream provided by the input modules to the router (and from there to processing cards) is similar to SMPTE 125M, it differs in one way. The number of samples during the active line time will always be 1440 (720 Luminance, 360 Chrominance Cr, 360 Chrominance Cb), preceded by the SAV code and trailed by the EAV code. The variance from the standard comes during the blanking time.

During blanking the nominal number of clock periods is 268 (exclusive of the EAV and SAV codes). The data stream from an input module is allowed to contain a variable number of clock periods during this time. With the allowable variance the number of actual clock periods is between 108 and 428 (268±160).

In some embodiments, it may be useful to perform other processing functions in the input modules, for example, color correction. Furthermore, time frame synchronization may be done on these cards.

Router 115

The router 115 is situated downstream of the video input modules 110 and operates, responsive to the coordinator, to send an input data stream from any of certain input sources to any one or more of the upstream video processing cards 120. Furthermore, a single data stream from an input source can be sent via the router to two or more upstream video processing cards, which may produce specialized effects, for example.

The input sources available to the router 115 include the following, each of which is coupled to the router 115 as shown in FIG. 2: (1) the video input modules 110, and (2) the downstream video processing cards 140, including the output encoder 230. In the preferred embodiment, two independent 9×8 routers are included—one to route video signals and another to route alpha signals. Although a new router design may be used, the present invention may instead use a number of different conventional routers, whose operation and construction is known to those of ordinary skill in the art. Each of eight data inputs for each type of signal can be routed to one or more video processing cards simultaneously. The ninth input is configurable to accept video from any of a number of other sources, such as the I/O modules, which may be configured to accept an input.

Upstream Video Processing Cards 120

The upstream video processing cards 120 receive data from the router 115, which may be in the form of a video signal and an alpha signal, for example. The upstream video processing cards 120 process this data and then supply the processed data to the video bus 185. Each upstream video processing card 120 has circuitry to perform a specialized function that may vary with the particular card and its design. Some of these upstream video processing functions may comprise functions such as the following:

1. Digital video effects, such as rotation, compressions, scaling, 3-D mapping, and various other spatial characteristic modifications.
2. Frame synchronization (also called "time base correction"), where input data from a medium such as tape is copied into RAM and spooled out at a desired rate.
3. Non-linear editing.
4. "Cascading" functions, where input data is processed by one upstream video processing card, then re-routed to another for processing therein.
5. Filtering, where image characteristics such as color are altered.
6. Standards conversion, as in PAL to NTSC conversion.

In the preferred embodiment, up to eight upstream video processing cards 120 can be installed in the slots 320, allowing eight simultaneous video sources with independent digital effects on each.

As stated above, video and alpha data delivered to the upstream video processing cards 120 is in the format provided by the input module. Processing cards will utilize this data in varying manners, as is appropriate to their particular functionality.

After such processing, the video and alpha data is formatted as parallel data streams and presented onto the video bus 185. A 13.5 MHz clock (not shown) is provided to synchronize the delivery of data for these busses.

Driver Fault Protection

The upstream video processing cards 120 are coupled to the main control bus 180, which in the preferred embodiment is a high-speed bus that has a number of cards coupled thereto. In order to attain high speed, the voltage must be able to switch very quickly. In order to overcome the high capacitance of a lengthy bus line, a strong driver is required to provide high current quickly. However, such design can create a problem during a malfunction. Particularly, if a short circuit occurs, or if one device tries to drive the bus low while another is driving it high, the results could be destructive.

In the preferred embodiment, each of the upstream video processing cards 120 includes circuits to detect contention between their drivers and those of another device connected to the main control bus 180. A dedicated fault line is provided or the main control bus 180 so that each upstream video processing card 120 can notify the coordinator of a fault detected by it. This dedicated fault line is termed the "/Fault" line. These detection circuits on the video processing cards measure the $V_{CC}$ current on the bus drivers. If such a sensing device detects a fault, then it executes a predetermined protocol to inform the coordinator via the dedicated fault line, which can then address the problem, and sometimes correct it. As with a bus timeout, bus faults are not a normal operation, but instead are events that should be avoided if at all possible.

Upon detection of a fault by an upstream video processing card 120, the card executes steps to place its bus drivers and address decode logic into a state corresponding to the state in existence after power-up but before a bus address has been assigned. At the same time, the card pulls down the /Fault line as well as its own interrupt line.

When the coordinator recognizes that the /Fault line has been asserted, it issues a NOP command to clear the bus of all signal traffic. Subsequently, the coordinator 160 attempts to turn off any pending interrupts. Because the device asserting the fault condition no longer responds to any bus addresses, the coordinator 160 will be unable to clear the interrupts from these devices that are asserting the fault condition and therefore end the fault state. By this process, the coordinator 160 can identify the offending devices and proceed to re-initialize them as necessary.

This bus fault detection system is very useful to prevent damage to devices on the main control bus 180. It is particularly advantageous when, as in the main control bus configuration, multiple cards are connected to the same bus. Although it is possible that the first video card to detect a fault condition may not be the device causing the condition, detecting the fault immediately assists the coordinator 160 to eventually find the cause of the fault. In some instances, the coordinator 160 may find the fault and not be able to correct it. In those instances, an error signal may be generated to notify the user of the existence of a problem and its cause, at least as well as known.

Switcher 130

Reference is made to FIG. 4, which shows one embodiment of a switcher 130 that provides real-time compositing of multiple video and alpha inputs, together with two still-store channels to color mattes, and a graphics layer. In a preferred embodiment, all compositing may occur in real-time, without time-consuming rendering operations.

Generally, the switcher 130 combines output of the upstream video processing cards 120 to form a composited video output. The inputs are provided by the video A, video B or video C lines from the video bus 185.

The switcher 130 includes alpha buffers 130a–130b to receive alpha signals from the upstream video processing cards 120. Mixers 130c–130d receive video data signals from the upstream video processing cards 120 and combine these signals according to the appropriate alpha signals. The switcher's output signal (the "composited video signal") is provided to the first one or a series of daisy-chained downstream video processing cards 140.

Key Priority Tree Processor 190

To provide for advanced layering capabilities, the switcher 130 also includes a key priority scheme in which upstream video processing cards provide priority information to the switcher in advance of actual pixel data. The switcher can thus arbitrate and select which sources are to appear on each of the three video and two alpha busses. This is done on a pixel-by-pixel basis. Based on these selections the switcher will output a 3-bit address for each bus to indicate to the processing cards which is to deliver data for that pixel.

Figure 10:
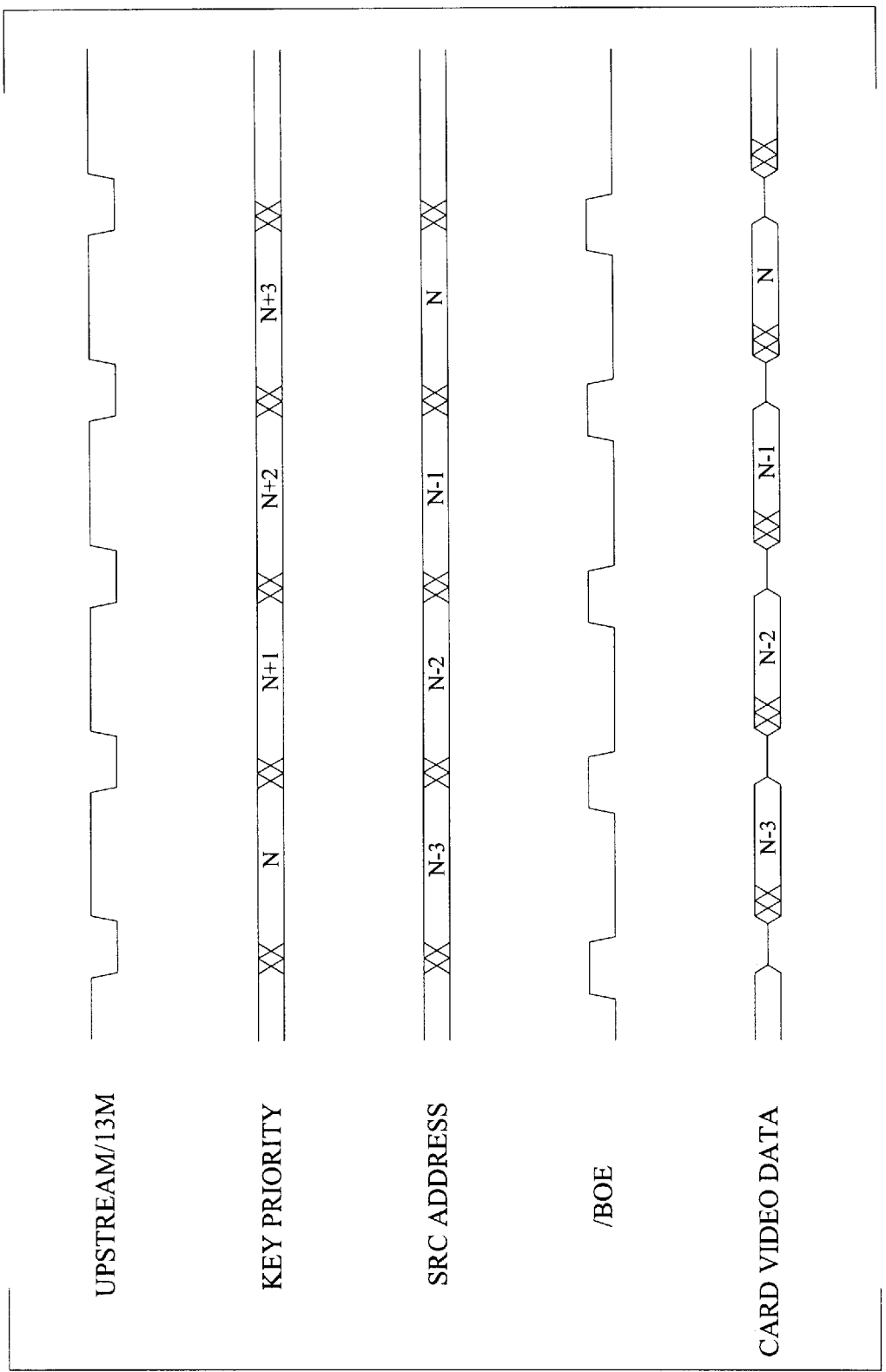
FIG. 10 is a timing diagram showing a relationship between key priority, source address, and video/alpha data in accordance with the invention.
Figure 11:
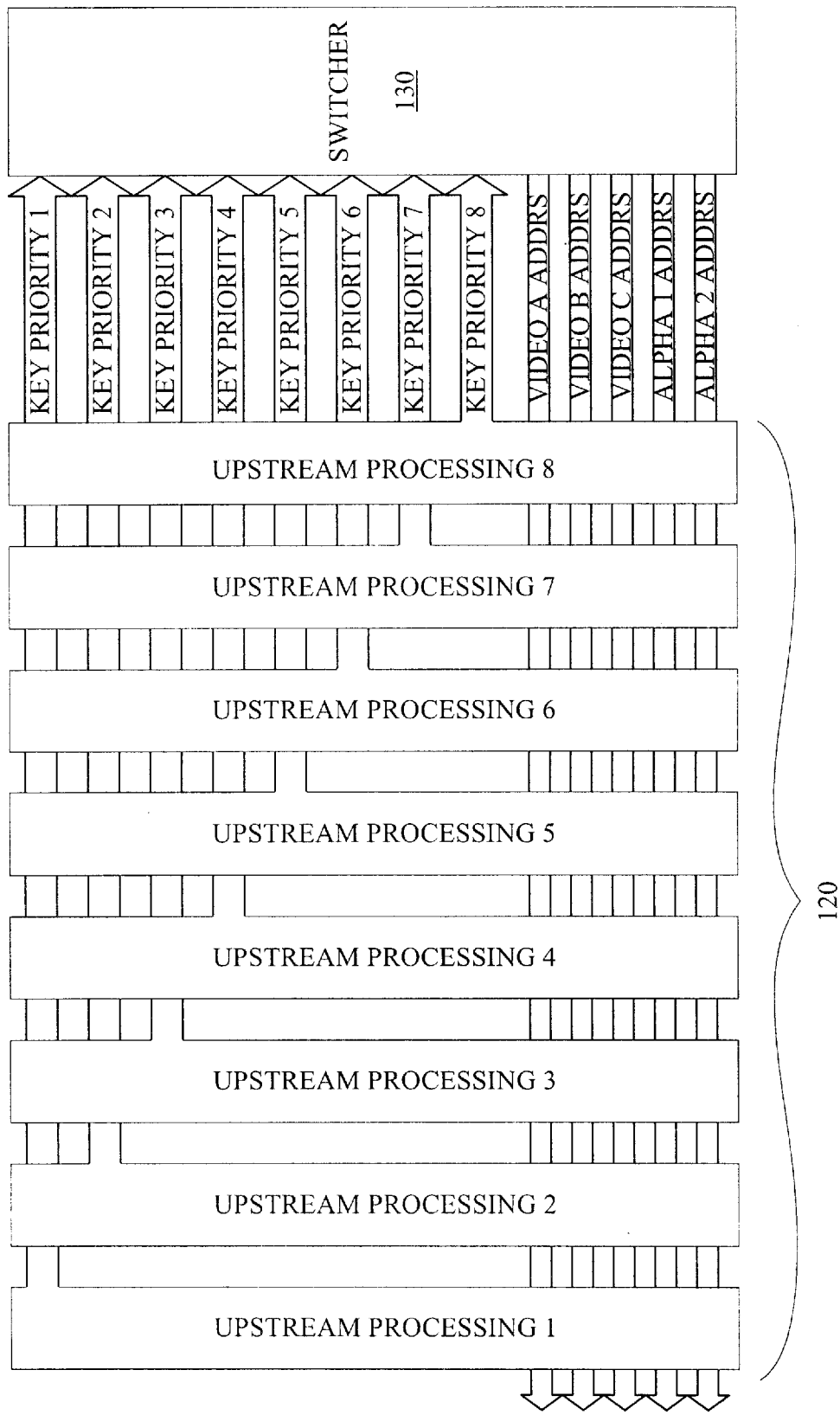
FIG. 11 is a signal flow diagram depicting the exchange of key priority video, and alpha signals between a switcher and upstream video processing cards in accordance with the invention.

In order to allow enough time for the switcher to properly arbitrate data selection the key priority data must be provided by a card three pixels ahead of the actual pixel time. FIG. 10 shows an exemplary relationship between key priority, source address and video/alpha data. While there is only one key priority signal from each upstream video processing card 120 to the switcher 130, there are separate addresses for each of the three video and two alpha busses, allowing for unique selection of up to five sources for any given pixel. FIG. 11 illustrates this structure in greater detail.

Downstream Video Processing Cards 140

The composited video signal from the switcher 130 is supplied to the downstream video processing cards 140 for further processing. If multiple downstream video processing cards 140 are implemented, the video signal passes from card to card in a sequential manner; particularly, the composited video output from the switcher goes to a first downstream video processing card, then to a second downstream video processing card, then to a third, and so forth. The downstream video processing cards may perform a variety of functions, such as character generation (e.g., subtitles), graphics overlay, etc. As one example, each downstream video processing card 140 may provide character generation in a different human language, such as English, Spanish, German, French, etc.

Each card is associated with one of the I/O modules 150, with which the card may transfer or receive signals. This system allows for additional video sources to be inserted into the video stream, or allow for multiple simultaneous otherwise incompatible video output formats.

The downstream video processing cards 140 provide another level of video manipulation and effects. For example, high-speed disk controllers can be inserted in the form of a downstream video processing card, as well as extra NLE channels. Keyer circuits and logo insertion circuits could be added in the form of a downstream video processing card. Furthermore, three-dimensional animation could be enhanced by providing a downstream three-dimensional rendering accelerator card. Also, downstream processing may be employed to receive an uncompressed video-capture system and pass it along without compression for users who need maximum quality without compression artifacts.

In the illustrated embodiment, the final downstream video processing card is referred to as the output encoder 230 (see FIG. 2). In this arrangement, the output encoder resides in the last downstream video processing card slot 341d–342d, and serves to encode the downstream-processed video signal (having the internal standard video format) into an appropriate output format, preferably including composite video, SVHS, and alpha signals or some known video interface format. The output encoder 230 may function as a master output encoder or a slave output encoder. In addition to providing the desired output format, a master output encoder generates various clock and synchronization signals for the video processing cards 120/140. Then signals may also be used by the coordinator 160 to synchronize its own operations. The output encoder 230 may generate its clock and synchronization signals in a standalone ("free-running") or externally synchronized ("gemlocked") mode, as appropriate to the particular application.

As an alternative, the output encoder 230 may operate as a slave output encoder. In this mode, the output encoder 230 does not generate the clock and synchronization signals of a master output encoder. Rather, the slave output encoder synchronizes itself to such signals, provided by another source. The downstream video processing card that receives its video signal last in the sequence (i.e., the output encoder 230) provides a video reference in order to clock the coordinator 160 to provide a video reference for the entire system. Alternatively, the system can be fed a synchronization signal from another source.

I/O Modules 150

The I/O modules 150 are provided primarily for the purpose of converting an output CCIR-601 signal (the internal standard herein) into predetermined output formats. In one embodiment, the output modules convert from the internal standard CCIR-601 digital format to composite plus Y/C format (which is compatible with Hi8/S-VHS). An output module may be designed to perform other format conversions; for example, the receiver source can be component YUV/RGB (beta cam). Other conversions are D2/D3, D1/D5, ATM/FDDI, DVC, MPEG-1 or MPEG-2 encoder.

Alternatively, any one or more of the output module slots may be filled by a circuit that provides video input to its associated downstream video processing card 140.

As an exemplary embodiment, the I/O modules may provide RS-422 ports 410 (FIG. 4), one or more being allocated for source video tape recorders (VTRs) and one or more for destination VTR (called "ABC-roll editing"). Of course, in other embodiments, other serial formats such as RS-232C and CTRL-L could also be accommodated.

Secondary Control Bus 175

Figure 5:
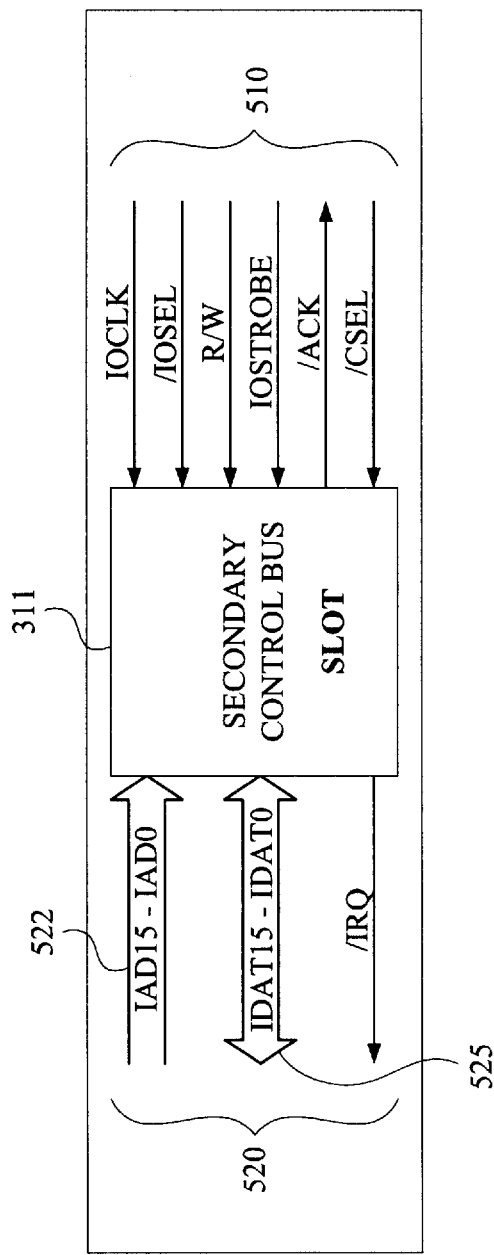
FIG. 5 is a diagram of an illustrative secondary control bus slot in accordance with the invention.

Reference is now made to FIG. 5, which is a diagram of a secondary control bus slot 311 and the secondary control bus lines connected therewith, including signal lines 510 and address or data lines 520. The secondary control bus 175 provides communication between the coordinator and each of the components thereon, including the video input modules 110, the router 115, the I/O modules 150, and (optionally) the audio connector 178. The secondary control bus includes a 16-bit address bus 522, and during all transactions the coordinator outputs a valid 16-bit address. Additionally, a 16-bit bi-directional data bus 525 is provided. During write transactions the coordinator outputs data on these pins, and during read transactions these lines are driven by the selected device. The coordinator 160 provides the following signals on the secondary control bus in a preferred embodiment.

| | |
|---|---|
| IOCLK | I/O Bus Clock. |
| /IOSEL | I/O Bus Slot Select. Each slot has a unique signal line. When asserted it indicates that the current cycle is a Write to or Read from a device. |
| R/W | Read/Write. When in a first state it indicates a Read cycle is currently in progress; when in a second state it indicates that a Write cycle is in progress. |
| B/W | Byte/Word. When in a first state this signal indicates a 16-bit data transfer; when in a second state it indicates an 8-bit transfer. |
| /IOSTRB | I/O Strobe. |
| IADRS15-0 | 16-bit Address Bus. During all transactions the coordinator will output a valid 16-bit address on these lines. |
| /CSEL | Configuration Select. Used for identifying and optionally configuring the device. |

The following signals on the secondary control bus are supplied by the coordinator 160 or another device on the secondary control bus 175:

| | |
|---|---|
| IDAT15-0 | 16-bit Bi-Directional Data Bus. During Write transactions the coordinator will output data on these pins; during Read transactions these lines will be driven by the selected device. |
| /ACK Device Acknowledge. | Used by the selected device to acknowledge a data transfer. May be used by a device to add wait states to extend a cycle. |
| /IRQ | Interrupt. Used if device requires immediate attention. |
| IO CLK | I/O Bus Clock. |
| /IOSEL | I/O Bus Slot Select. |
| R/W | Read/Write. |
| /IOSTROBE | I/O Strobe. |
| /CSEL | Configuration Select. |
| IAD/5-IAD4 | 16-bit address bus. |

Main Control Bus 180

Figure 6:
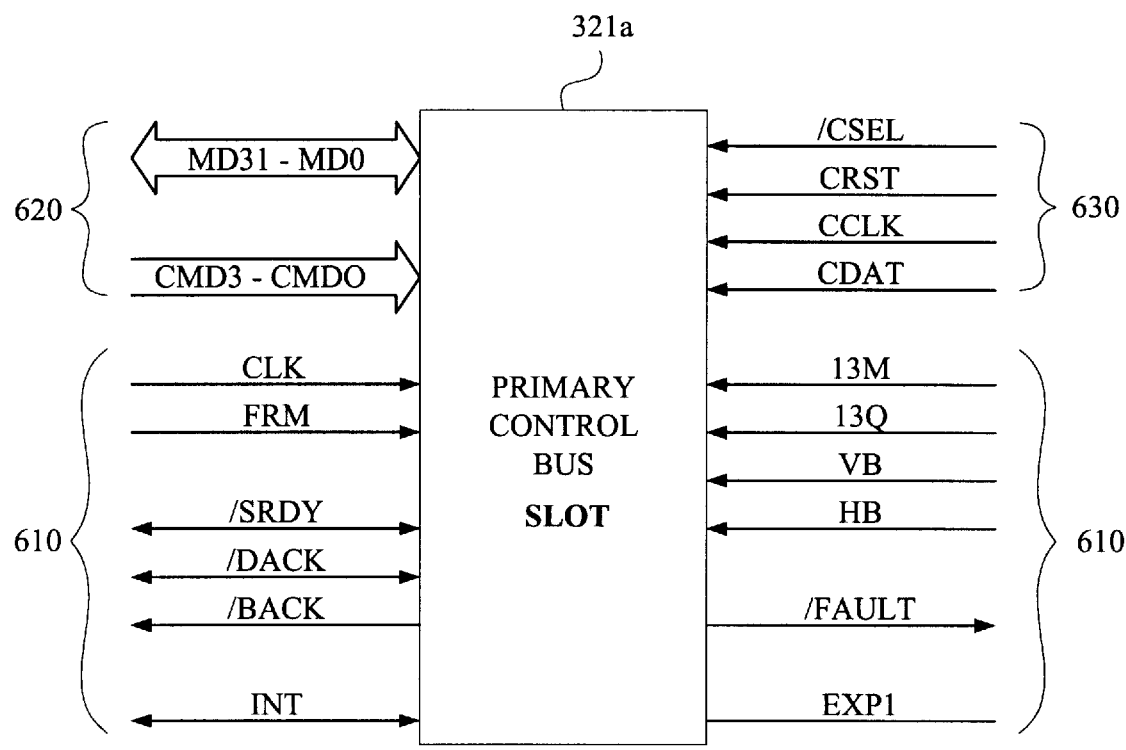
FIG. 6 is a diagram of an illustrative primary control bus slot in accordance with the invention.

Reference is now made to FIG. 6 which is a diagram of a primary control bus slot such as the video processing slot 321a, and the main control bus lines connected therewith, including signal lines 610, described in detail below, and data and command lines 620, also described in more detail below. In addition, a plurality of configuration lines 630, including the /CSEL, CRST, CCLK, and CDAT lines are provided to define a configuration bus that is dedicated solely to configuration of the video processing cards.

Figure 7:
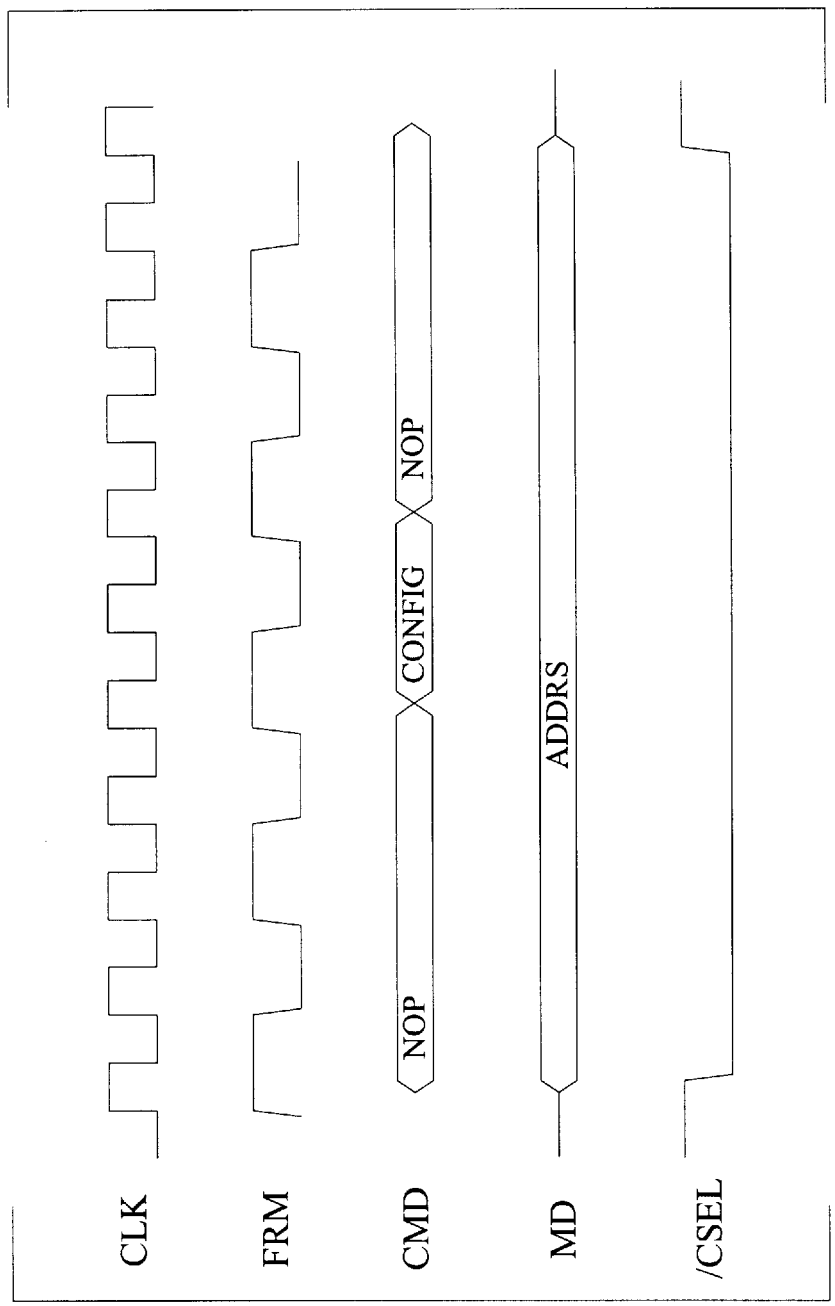
FIG. 7 is a timing diagram of an exemplary configuration cycle in accordance with the invention.

FIG. 7 is a diagram showing the timing of an exemplary configuration cycle. Briefly, upon power-up the only pins required to be operating are the four configuration pins, and using these pins, the coordinator can set up each of the video cards according to pre-programmed instructions. Unlike conventional bus configuration which require all pins to be operable upon start-up, the configuration described herein allows great flexibility in determining the functions of the cards during configuration. Particularly, many of the fundamental functions of the cards can be provided via a data and command stream during configuration, and then subsequently operation will proceed in accordance with that programming. Advantageously, this allows wide use of programmable circuits on the video processing cards, so that updating can occur as needed, without the need to replace hardware.

The main control bus in the preferred embodiment is a high-bandwidth, low overhead general purpose data transfer but that can achieve and sustain 80 megabytes per second transfer rates. In general terms, the main control bus moves data between the coordinator and the video upstream video processing cards, the switcher, and the downstream video processing cards. As described above, the coordinator 160 handles communication with external devices.

| | |
|---|---|
| CLK | System Clock. Together with the FRM signal (described below), this clock is used to sample all lines on the main control bus. |
| FRM | FRAME bus control signal. This signal will be high one clock cycle before the actual clock edge to be used to clock in commands and data. It can be either a divide-by-2 or -by-3 relative to CLK. In the divide-by-3 format an extra clock cycle is effectively added to the beginning of each state. |
| MD31-0 | Multiplexed Address/Data lines. During address phases the coordinator will output a 32-bit address on these lines. During data phases and DMA these lines will be driven by the applicable data source. |
| CMD3-0 | Bus Command lines. During all states of any bus transaction a command code will appear on these pins. |
| /SRDY | Source Ready. When asserted indicates that valid data is present on MD31-0. May be used by the source to add wait states to the current data phase. For Write transactions this signal is driven by te coordinator; in Read transaction it will be driven by source being read; during DMA transactions it will be driven by the Source device. |
| /DACK | Destination Acknowledge. When asserted indicates that the destination device is ready to accept data. When both /SRDY and /DACK are asserted at a valid clock the current data phase is completed. For Write transactions this signal is driven by the destination being written to; in Read transactions it will be driven by the coordinator; during DMA transaction it will be driven by the Destination device. |
| /BACK | Burst Acknowledge. When asserted indicates that a burst transaction may continue with further data phases. May be used by a card to terminate a burst transaction. If a burst command is not acknowledged it will be terminated automatically after the first data phase via a NOP command. |
| /INT | Interrupt and Configuration control line (unique to each slot). During configuration (/CSEL asserted) this line is used as an output to provide the coordinator information about the selected card. During a fault condition this line is used as an output to indicate to the coordinator that it has detected a driver fault (active LO). During normal operation this line serves as an interrupt request line to the coordinator and is active LO. |
| /FAULT | Driver Fault. When asserted indicates that a card has detected |

-continued

| | |
|---|---|
| /13M | a potential "fight state" between drivers on the MD lines.<br>Main 13.5 MHz video bus clock. This is the signal used to clock data onto the video busses. |
| /13Q | 13.5 MHz video bus clock, 180 degrees out of phase with 13M. |
| VB | Vertical Blanking pulse. |
| HB | Horizontal Blanking pulse. |

The following configuration signals 630 define the configuration bus:

| | |
|---|---|
| /CSEL | Configuration Select. When asserted indicates that the signals CDAT, CRST and CCLK are active for the selected card. Also used to indicate the destination of a CONFIG bus command. |
| CDAT | Configuration Data. |
| CRST | Configuration Reset. |
| CCLK | Configuration Clock. |

Configuration

Configuration of boards is done in several steps, using the configuration lines described above. Once a board is initialized and ready to receive a base address, the coordinator will assert a /CSEL signal to indicate the destination of the following Config cycle. At the same time it will issue a NOP command and place the base address to be latched onto the MD31-0 lines. After a minimum setup time of 100 ns a CONFIG command (0010) will be issued by the coordinator, that will indicate to the selected circuit that it should latch the base address supplied. After the CONFIG command is issued, the coordinator will again issue a NOP.

Direct memory Access

Figure 8:
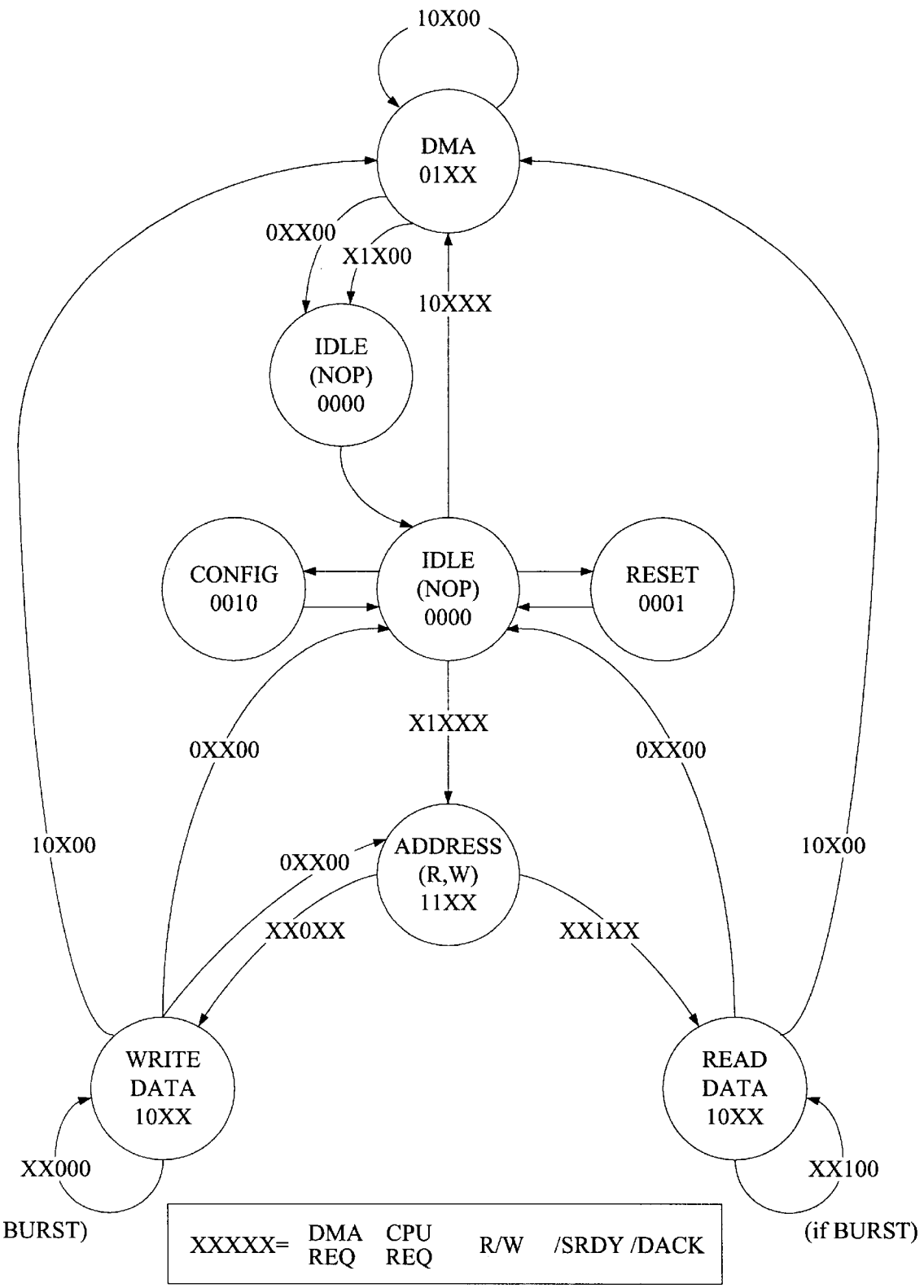
FIG. 8 is a state diagram showing operations performed by the coordinator in accordance with the invention.

Reference is made to FIG. 8, which is a state diagram of operations performed by the coordinator in order to accomplish direct memory access (DMA) transfers from the coordinator to (usually) the upstream video processing cards, but also to or between any other devices on the main control bus. DMA transfers are supported on the main control bus to allow large amounts of data to be transferred between devices in an efficient manner. All DMA transactions are set up via transactions between the coordinator 160 and the boards requiring DMA service. The coordinator 160 assigns one device to be the source and one device to be the destination for a particular DMA channel. Although the coordinator 160 is the master controller for all bus transactions, the source and destination devices for a DMA channel may both be devices other than the coordinator 160. Furthermore, the coordinator 160 itself may also be either the source or destination device.

Figure 9:
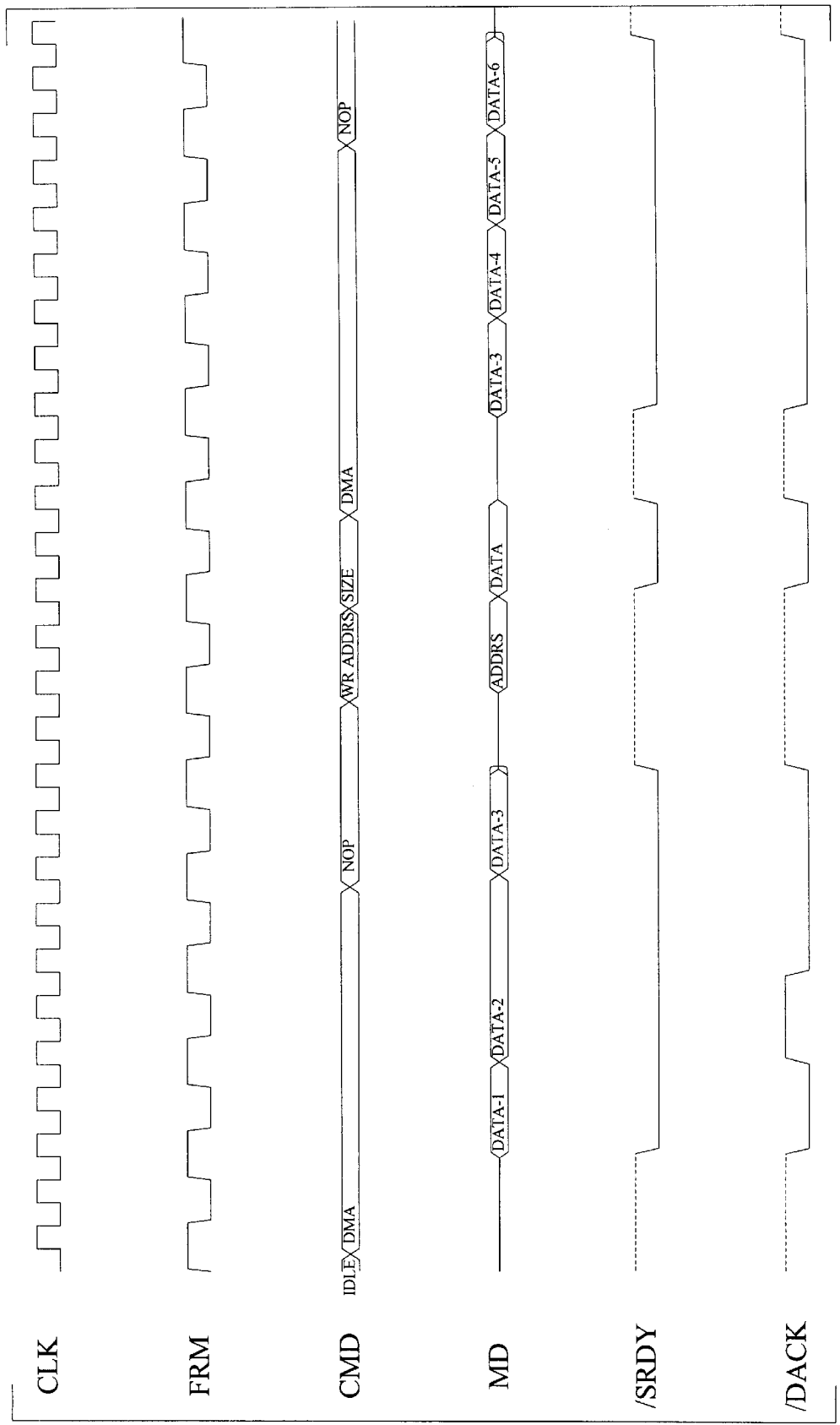
FIG. 9 is a timing diagram of an exemplary DMA transition in accordance with the invention.

Once a DMA channel has been assigned to two boards the coordinator will control DMA activity, interleaving non-DMA cycles as necessary. FIG. 9 shows typical DMA activity with a write cycle inserted by the coordinator in the middle of the DMA stream. As with Read and Write transactions, /SRDY and /DACK are used to pace the transfer of data between the source and destination devices. In the example of FIG. 9, a wait state has been added during the Data-2 block by the destination.

Any interruption of a DMA sequence by the coordinator 160 will start with a NOP command. The DMA source should continue to place new data onto the bus as each data transfer is completed (/SRDY and /DACK both asserted at a valid clock). As shown in FIG. 9, when Data-3 is placed on the bus, the coordinator interrupts the DMA flow to insert another command. Although the data is actually valid (and acknowledged) it is considered invalid due to the DMA being terminated by a NOP. When the DMA transfer resumes, Data-3 is the first transferred due to being previously invalidated.

In the preferred embodiment, there are 4 DMA channels available. The coordinator will allocate cycles as necessary, based on which DMA channels are active and what other traffic is required on the bus. The minimum number of data transfers that will be completed for a given DMA channel before another DMA channel becomes active is considered one DMA block. All data transfers are 32-bit; DMA block length will be either 64 transfers or some variable size determined by software. All devices that support DMA should support a DMA block size of 64.

Video Bus 185

The video bus 185 provides data transfer between the upstream processing cards 120 and the switcher 130. In the preferred embodiment, three 20-bit digital video busses, and two 10-bit alpha busses are provided. The key priority three processor 190 allows each card to specify a priority for each individual pixel that it wants to transmit over the bus. The key priority tree processor 190 then determines which video processing card actually has the bus and therefore can emit the actual video signal onto the bus. Thus, multiple video processing cards (in the illustrated embodiment, up to eight) can emit data onto a single video bus; allowing the multiple sources to each participate in one video frame.

Audio Connector 178

In one embodiment, audio circuits (not shown) may be situated apart from the main motherboard. To facilitate the use of such cards, audio connector 178 is attached directly to the secondary control bus or the main control bus to provide synchronization and control.

Non-linear Media Storage

A number of options are available to integrate non-linear media storage into the system disclosed herein. In one embodiment, a communication circuit card connected to a storage device is coupled in the same manner as a video processing card to the main control bus, the router, and the video bus. Thus, the circuit card provides communication from the router to the storage device and then from the storage device to the video bus. A chassis in which the system resides may have a number of disk drives (SCSI hard disk drives) included therein, and external drives if needed.

Other embodiments and modifications of this invention may occur to those of ordinary skill in the art in view of these teachings. Therefore, this invention is to be limited only by the following claims, which include all such embodiments and modifications when viewed in conjunction with the above specification and accompanying drawings.

OTHER EMBODIMENTS

While there have been shown what are presently considered to be preferred embodiments of the invention, it will be apparent to those skilled in the art that various changes and modifications can be made herein without departing from the scope of the invention as defined by the appended claims.

What is claimed is:

1. A video processing system for processing at least one video input signal comprising:
   a main control bus;
   a secondary control bus;
   a video bus;
   a composited video signal bus;
   a coordinator coupled to the main bus and the secondary control bus to provide respective control signals on the main bus and the secondary control bus;

at least one input module coupled to the secondary control bus, each input module receiving an input video signal and converting the received video input signal to a predetermined internal video format in response to control information received from the coordinator via the secondary control bus;

a router coupled to the secondary control bus, the router having router inputs coupled to the at least one input module, the router inputs receiving converted video input signals from the input modules, the router also having a plurality of router outputs to supply selected ones of the converted video input signals to selected router outputs in accordance with control signals received from the coordinator;

at least one upstream video processing card, each upstream video processing card being coupled to the video bus and also being coupled to the main control bus to exchange control information with the coordinator, each upstream video processing card being coupled to a different router output to receive a predetermined converted video input signal, to apply upstream video processing to the received converted video input signal, and to supply the upstream-processed signal to the video bus;

a switcher coupled to the video bus to receive the upstream-processed video signal from the upstream video processing card, the switcher also being coupled to the main control bus, the switcher combining the upstream-processed video signals in accordance with control information received from the coordinator via the main control bus to provide a composited video signal, the switcher providing an output of the composited video signal on the composited video signal bus;

multiple serially connected downstream video processing cards including a first downstream video processing card coupled to the switcher and a final downstream video processing card, the first downstream video processing card being coupled to the composited video signal but to receive and process processing the composited video signal, each downstream video processing card also being coupled to the main control bus to exchange control information with the coordinator; and at least one video I/O module, each video I/O module being coupled to one of the downstream video processing cards to exchange video signals therewith.

2. The video processing system of claim 1, the video bus comprising a plurality of video lines and plurality of alpha lines.

3. The video processing system of claim 2, the video bus further comprising:

a priority signal generator in each video processing card;

a key priority tree processor including a programmable arbitration circuit responsive to the priority signals; and an enabling circuit for each upstream video processing card, the enabling circuit coupled between the video card and the plurality of video and alpha lines, each enabling circuit responsive to arbitration in the key priority tree processor.

4. The video processing system of claim 1, further comprising an audio connector coupled to the coordinator.

5. The video processing system of claim 4, the audio connector being coupled to the secondary control bus.

6. The video processing system of claim 4, the audio connector being coupled to the main control bus.

7. The video processing system of claim 1, each input module converting each video input signal into CCIR-601 digital format.

8. The video processing system of claim 1, the main control comprising:

a control and data bus; and a configuration bus.

9. The video processing system of claim 1, the coordinator including an external connector to exchange signals with an external control device.

10. The video processing system of claim 1, the coordinator including an external connector;

the video processing system further including a personal computer coupled to the external connector to exchange signals with the coordinator to manage operation of the coordinator.

11. The video processing system of claim 1, the coordinator including an external connector;

the video processing system further including a keyboard coupled to the external connector to exchange signals with the coordinator to manage operation of the coordinator.

12. The video processing system of claim 1, wherein each upstream video processing card applies at least one of the following effects: spatial characteristic modification, frame synchronization, non-linear editing, and filtering.

13. The video processing system of claim 1, wherein each downstream video processing card applies at least one of the following effects: adding subtitle text to the composited video signal, applying video keying to the composited video signal, overlaying at least one predetermined graphic element to the composited video signal, and applying a predetermined encoding process to the composited video signal.

14. The video processing system of claim 13, wherein each of multiple downstream video processing cards adds a different language of subtitle.

15. The video processing system of claim 1, the coordinator comprising a microprocessor.

16. The video processing system of claim 1, one of the video I/O modules comprising a source providing input graphics data to its corresponding downstream video processing card.

17. The video processing system of claim 1, further comprising:

a preview module coupled to the switcher to receive signals being combined by the switcher and provide a video output having a format compatible with a predetermined type of viewing device.

18. The video processing system of claim 1, further comprising:

a video monitor;

a preview module coupled to the switcher, and also coupled to the video monitor, to receive signals being combined by the switcher and provide the video monitor with a video output having a format compatible with the video monitor.

19. The video processing system of claim 1, further comprising at least one expansion connector coupled to the main control bus.

20. A motherboard comprising:

a secondary control bus;

a main control bus;

a video bus;

a group of coordinator slots including a first coordinator slot coupled to the secondary control bus and a second coordinator slot coupled to the main control bus;

a input connector to receive input video signals;

at least one input module slot coupled to the input connector and also coupled to the secondary control bus;

a router slot coupled to the at least one input module slot and also coupled to the secondary control bus;

a first group of at least one upstream video processing card slots each coupled to a different router slot, a second group of at least one upstream video processing card slots each coupled to the main control bus, and a third group of at least one upstream video processing slots each coupled to the video bus;

a switcher slot group including a first switcher slot coupled to the video bus, a second switcher slot coupled to the main control bus, and a third switcher slot; and a downstream video processing card slot group comprising multiple serially-connected downstream video processing card slots including at least a first downstream video processing card slot coupled to the third switcher slot and a second downstream video processing card slot coupled to an output connector.

21. The motherboard of claim 20, the main control bus including:

a control and data bus; and a configuration bus.

22. The motherboard of claim 21, the control and data bus having a 32-bit width and the configuration bus having a 4-bit width.

23. The motherboard of claim 20, the main control bus having a 36-bit width.

24. The motherboard of claim 20, the composited video signal bus having a 30-bit width.

25. The motherboard of claim 20, the secondary control bus having a 32-bit width.

26. The motherboard of claim 20, the video bus having an 80-bit width.

27. A method of processing video signals, comprising the steps of:

receiving at least one input video signal with at least one input module, each of the video signals having a predetermined input format;

at least input module receiving an input video signal, converting the input video signal to an internal format;

routing each of the converted input video signals to at least one of multiple upstream video processing cards;

at each upstream video processing card, applying a predetermined upstream video processing technique to the converted input video signal received therein to provide an upstream-processed video signal;

combining each of the upstream-processed video signals to form a composited video signal;

directing the composited video signal in series to multiple downstream video processing cards including at least a first downstream video processing card and a final video processing downstream video processing card;

at the first downstream video processing card, integrating the composited video signal with a secondary input signal to provide a downstream-processed video signal; and at the final downstream video processing card, converting the downstream-processed video signal into a predetermined output format.

28. The method of claim 27, further comprising the step of:

routing the downstream-processed video signal to at least one of the upstream video processing cards and, in each of the upstream video processing cards, applying a predetermined video processing technique to the downstream-processed video signal to provide a re-processed video signal.

29. The method of claim 27, further comprising the step of:

directing the composited video signal to a video monitor to review the composited video signal.

30. The method of claim 27, the predetermined input format being one of the following formats: RGB, bnc-composite, serial digital, parallel digital, consumer digital video format, or MPEG data stream.

31. The method of claim 27, the internal format being CCIR-601 digital format.

32. The method of claim 27, the output format being one of the following formats: RGB, bnc-composite, serial digital, parallel digital, consumer digital video format, or MPEG data stream.

33. The method of claim 27, each upstream-processed video signal having a video component and an alpha component.

34. The method of claim 27, the predetermined upstream video processing technique of each upstream video processing card including at least one of the following effects: spatial characteristic modification, frame synchronization, non-linear editing, and filtering.

35. The method of claim 27, the predetermined downstream video processing technique of each downstream video processing card including application of at least one of the following effects: adding subtitle text to the composited video signal, applying video keying to the composited video signal, overlaying at least one predetermined graphic element to the composited video signal, and applying a predetermined encoding process to the composited video signal.

36. The method of claim 35, wherein multiple different downstream video processing cards add subtitle text of multiple different human languages.

37. The method of claim 27, further comprising the steps of:

prior to combining each of the upstream-processed video signals to form a composited video signal, routing at least one of the upstream-processed video signals back to at least one of the upstream video processing cards and applying the upstream video processing card's predetermined upstream video processing technique to the routed upstream-processed video signal to provide a cascaded video signal; and p1 wherein the combining step comprises the steps of combining the upstream-processed video signals and the cascaded video signal to form a composited video signal.

* * * * *